United States Patent [19]

Steffen et al.

[11] Patent Number: 4,857,483
[45] Date of Patent: Aug. 15, 1989

[54] METHOD FOR THE ENCAPSULATION OF INTEGRATED CIRCUITS

[75] Inventors: Francis Steffen; Jean Labelle, both of Aix-Les-Bains, France

[73] Assignee: SGS-Thomson Microelectronics S.A., Paris, France

[21] Appl. No.: 148,655

[22] PCT Filed: Apr. 29, 1987

[86] PCT No.: PCT/FR87/00143

§ 371 Date: Dec. 29, 1987

§ 102(e) Date: Dec. 29, 1987

[87] PCT Pub. No.: WO87/06763

PCT Pub. Date: Nov. 5, 1987

[30] Foreign Application Priority Data

Apr. 30, 1986 [FR] France ............................... 86 06333

[51] Int. Cl.$^4$ ............................................. H01L 21/56
[52] U.S. Cl. ..................................... 437/209; 437/219; 264/276.11; 357/74; 29/848; 29/856
[58] Field of Search .................. 437/209, 211, 214; 264/272.11, 272.13; 357/74; 29/856

[56] References Cited

FOREIGN PATENT DOCUMENTS

| 0110518 | 6/1984 | European Pat. Off. . | |
|---|---|---|---|
| 2390008 | 3/1978 | France . | |
| 2520541 | 7/1983 | France . | |
| 0162963 | 12/1979 | Japan | 437/211 |
| 0202745 | 12/1982 | Japan | 437/211 |
| 0027326 | 2/1983 | Japan | 437/211 |
| 0074446 | 4/1985 | Japan | 437/211 |
| 2164794 | 3/1986 | Japan . | |

*Primary Examiner*—Brian E. Hearn
*Assistant Examiner*—Beverly A. Pawlikowski
*Attorney, Agent, or Firm*—Oblon, Spivak, McClelland, Maier & Neustadt

[57] ABSTRACT

To encapsulate integrated circuits mounted on continuous dielectrical strips (surface-mounted circuits) it is proposed to transfer mold a thermosetting resin around circuits carried by the strip, the resin being injected outside the parting plane of the mold, contrary to the usual practice in this field. The protection of the circuits is improved while, at the same time, the ability to test the strip is preserved.

3 Claims, 2 Drawing Sheets

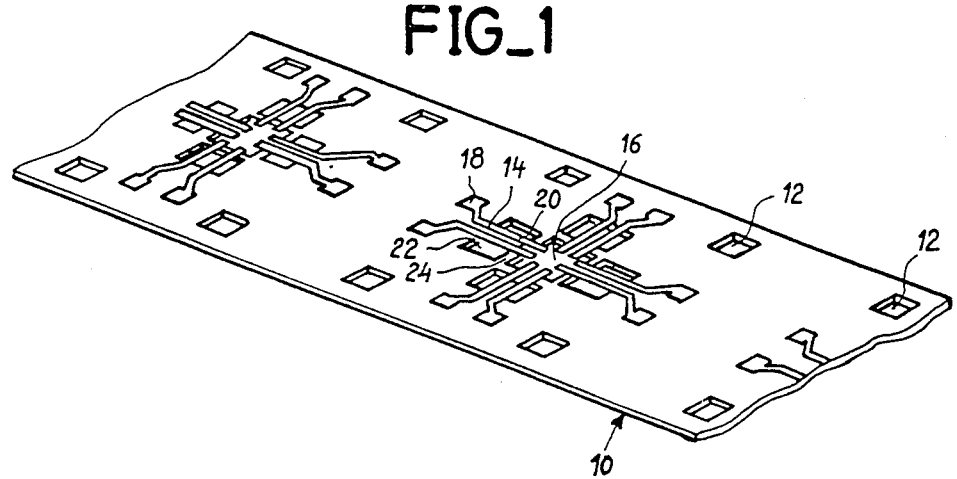
FIG_1
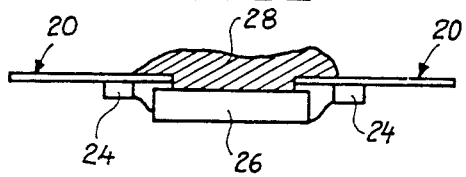
FIG_2
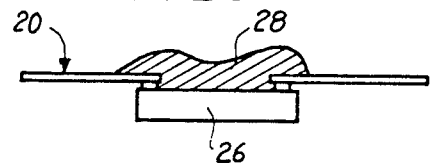
FIG_3
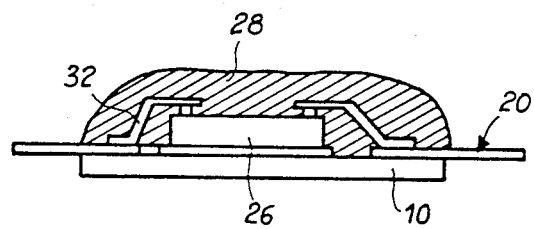
FIG_5
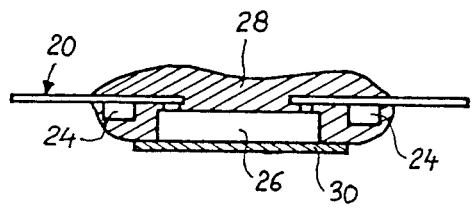
FIG_4
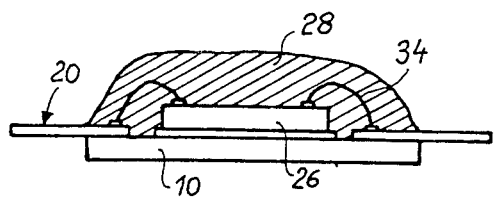
FIG_6

FIG_7
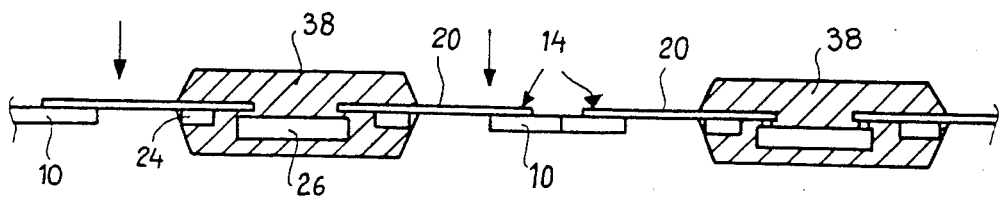
FIG_8
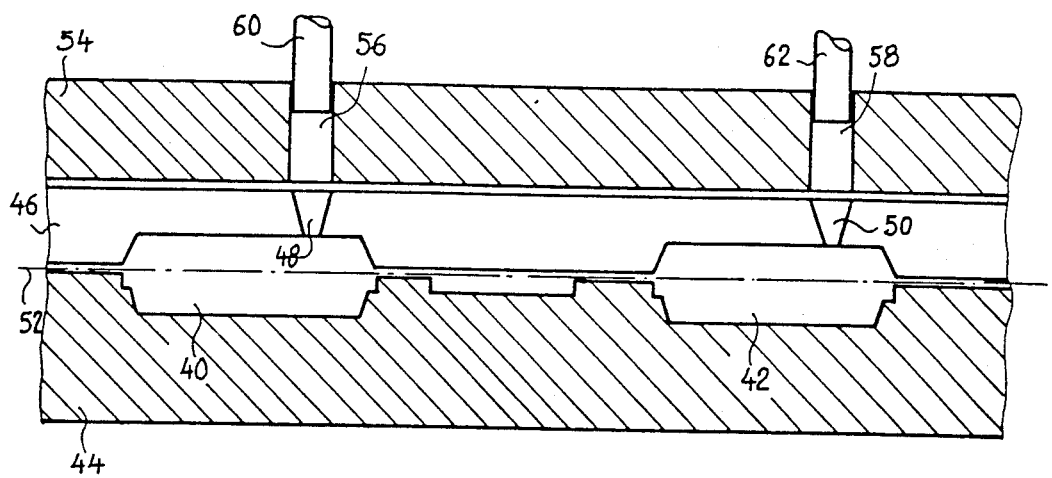
FIG_9
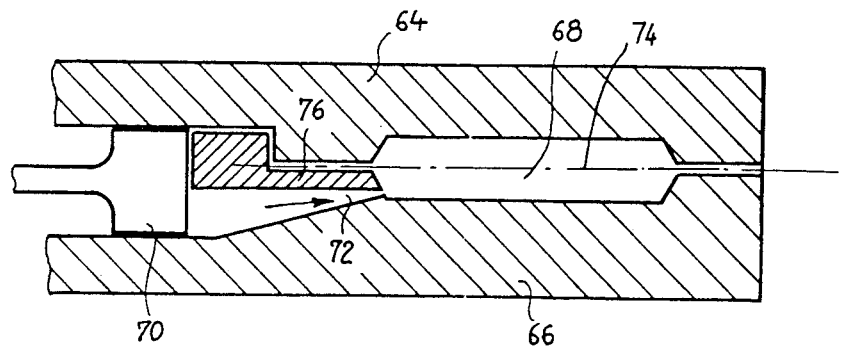

METHOD FOR THE ENCAPSULATION OF INTEGRATED CIRCUITS

BACKGROUND OF THE INVENTION

1. Field of the Invention

The present invention pertains to the encapsulation of integrated circuits.

2. Description of the Prior Art

Certain users of integrated circuits wish to be supplied with circuits in the form of continuous flexible strips (in rolls) bearing these integrated circuits.

This makes it easier for these users to automate the mounting of these integrated circuits on printed circuit boards or on other supports. This is especially the case with integrated circuits designed for surface-mounting. The surface-mounting of components is a type of mounting be automated far more easily than the mounting of components by insertion in holes drilled in printed boards.

Surface-mounting machines are fed with components in the form of coiled strips that carry components. These strips are carried forward step by step as with a cinematographic spool. It is only when the individual component is being mounted on a printed circuit that it is separated from the rest of the strip.

There are two main types of manufacturing processes for integrated circuit chips.

In the first type of manufacturing process, a cut-out metallic leadframe (a copper leadframe for example) is used as a supporting strip is used. For each component position, this leadframe has, firstly, a socket to receive an integrated circuit chip and, secondly, individual conductors, which act as external connection pins for the integrated circuit. To make the leadframe retain sufficient mechanical strength, the conductors forming the external pins are connected to one another by elements of the leadframe and they are therefore short-circuited with respect to one another. It is only when an individual component is being detached in order to be mounted that the pins are unshorted by sectioning the elements which connect the conductors to one another.

In the second type of manufacturing process, a dielectric film (generally a polyimide) is used as the supporting strip. On this support, a pattern of thin film conductors is formed. Here again, these conductors here again act as external pins for the component when it is being mounted on a printed circuit. The conductors are printed on the dielectrical film. Hence, it is the dielectrical film that gives them mechanical strength, even if, in certain places, this film has openings over which the conductors pass. It is not necessary to provide for joining elements between the various conductors to ensure their mechanical rigidity.

In practice, there are two major problems here. The first problem relates to the testing of the integrated circuits and the second relates to their protection.

As regards the test, with strips made from a cut-out metallic leadframe it is impossible, in principle, to test the circuits so long as they are on the strip since their pins continue to be short-circuited until they are separated into individual components. The test (on the wafer) can be done on the integrated circuit chip before this chip is fixed to the leadframe and connected to the conductors of this leadframe. The test could also be done after separating an individual component when it is mounted on a printed circuit, but that would be to late since it is preferable to supply the user with rolls of already-tested components.

Moreover, this is one of the reasons why there is a need felt for mounting the integrated circuits on dielectric films because, in this case, the pins are not short-circuited and the circuits can be tested on the strips.

With respect to the problem of protecting integrated circuits, these circuits are known to be chemically and mechanically very fragile and it is obviously out of the question that a user should be supplied with a strip of integrated circuits in which the circuit chips are not protected in one way or another against mechanical shocks, corrosive agents and, if necessary, against electromagnetic radiation.

For strips made from a conducting leadframe, this raises no problem: the protection is got by encapsulation in a thermosetting resin. The technique is the one currently used to make integrated circuits in plastic packages. This technique is the transfer molding technique in which the leadframe bearing the chips is placed in a mold and in which a thermosetting resin is injected around the entire piece.

Experience shows that this method of protection, as used conventionally to encapsulate integrated circuits in plastic packages, does not at all lend itself to the encapsulation of circuits mounted on dielectric strips. For the thermosetting resin is injected at a high temperature and irreversibly changes the shape of the dielectrical strip. The strip with its shape changed is not satisfactory in appearance and is unsuitable for winding in tight coils.

To shield integrated circuits mounted on dielectrical strips, a simpler method than that of transfer molding is used. A drop of a polymerizable resin is deposited on the chip. This drop of resin coats the chip and the ends of the printed conductors connected to the chip. However, the mechanical protection and protection against radiation obtained are far less than with a thermosetting resin. Sometimes even certain parts of the chip, for example the rear and the sides, remain bare. Furthermore, depositing a drop of resin does not at all make it possible to form a component with calibrated dimensions as would be the case with molded packages. The resin is shapeless and spreads in varying degrees, the total quantity deposited is variable, etc.

A complicated and expensive method has already been proposed in the prior art to reconcile the contradictory requirements of testing and protective quality, where the former requirement entails the choice of a dielectrical strip with printed conductors and the latter entails the choice of a cut-out metallic strip. In this prior art method a metallic leadframe is used, and the thermosetting resin molding operation entails making not only a plastic package that encloses the integrated circuit chip and lets the external connection pins, short-circuited by connecting bars, pass through, but also a peripheral plastic ring around the package. The external connection pins then extend between the package and the peripheral ring. They are rigidly held by the package on one side and by the ring on the other side, and they can then be unshorted by sectioning the connecting bars without affecting the mechanical strength of the strips. Outside the peripheral ring, testing pads connected to the connecting pins are held in place by the ring. The individual testing of each component is made easier by these pads. However, this test is possible only after separating the components into individual elements and cannot be done so long as they are in strips.

The protection is of high quality since it is done by molding a setting resin. The disadvantage of this method is its high cost, since the molds to be used are complicated, and the bulkiness that results from the use of peripheral ring is quite great. Furthermore, tests cannot be conducted on strips.

The present invention is based on the experimental observation that any change in the shape of the dielectrical strip which makes the transfer molding of a thermosetting resin impossible in principle, can be prevented by using a different molding operation from the usual one.

The method still used in prior art techniques for the encapsulation of integrated circuits in thermosetting resin is a molding between two molding plates which can be separated and which are closed after the conducting leadframe bearing the chips is placed between these plates. The thermosetting resin is injected through the parting plane between the two molding plates. This makes it easy to clean the molding plates and the resin injection hole after the molding has been done and after the strip of encapsulated components has been removed from the mold.

SUMMARY OF THE INVENTION

The present invention proposes to perform a so-called offset-injection molding operation normally used to mold thermoplastic resins rather than thermosetting resins, but which will be used here with a thermosetting resin. In offset injection molding, the resin is injected into the molding cavity formed between the molding plates, the injection being done through a hole which is not located in the parting plane between the molding plates.

It is observed that this type of molding eliminates difficulties encountered with molding of a conventional type.

It should be clearly understood that the reason why thermosetting resins are usually injected through the parting plane is that these resins solidify irreversibly when they cool down and that injection through a hole which does not open with the mold makes it far more difficult to clean the hole after each molding operation. By contrast, thermoplastic resins can be injected through a hole which does not open with the molding plates, because even if the resin hardens when it cools down, it melts again when it is re-heated. Here we shall use offset injection molding through a hole which does not open with the mold, but shall use a thermosetting resin.

Thus, instead of being limited by the notion that the thermosetting resin is at a temperature which is too high to be used without damaging the dielectrical strip that bears the integrated circuits, the present invention proposes to inject this very resin at the same temperature, but in a manner which is unusual for integrated circuits, and which, in principle, is not desirable for thermosetting resins.

BRIEF DESCRIPTION OF THE DRAWINGS

Other characteristics and advantages of the invention will emerge from the following detailed description made with reference to the appended drawings, of which:

FIG. 1 is a perspective view of a dielectrical strip bearing printed conductors;

FIG. 2 is a schematic view of enlarged cross-section of a chip on this strip;

FIGS. 3, 4, 5, and 6 show alternative modes of encapsulation according to the prior art;

FIG. 7 gives a lateral view of a strip of encapsulated components according to the present invention;

FIG. 8 gives a schematic view of the constitution of the mold by which this encapsulation can be done;

FIG. 9 shows an alternative embodiment of the mold.

DESCRIPTION OF PREFERRED EMBODIMENTS

FIG. 1 shows a continuous strip 10 made of a flexible dielectrical material intended to support integrated circuits and to be coiled so as to be delivered to a user in the form of rolls.

The strip 10 is, for example, a polyimide with a thickness of about 0.125 mm.

This strip 10 has side perforations 12 of the kind found on the edges of cinematographical films. These perforations are designed to enable the continuous automatic feed or step-by-step feed of the strip 10, both during the manufacturing of the strips that carry the integrated circuits and when these strips are being used to supply components to a machine that mounts components on printed circuit boards.

The strip 10 also has other perforations, the role of which will be explained further below.

The strip 10 further has thin film electrical conductors 14 printed on the upper surface of the strip. The term printed conductors refers to conductors shaped in a specified pattern, whether by photoetching or by any other means, the said conductors adhering to the surface of the strip.

These conductors adhere to the surface of the dielectrical film but, at certain places, they extend over the perforations formed in the dielectrical strip. At these places, the natural rigidity of the conducting film enables it to go over the perforations without any break in the conductors (the thickness of the conducting film being chosen accordingly).

The pattern of the conductors 14 and the pattern of the perforations over which these conductors pass is repeated at regular intervals all along the strip 10. Each pattern corresponds to the position of an integrated circuit to be mounted on the strip.

The conductors 14 are clearly separated from one another. They are not short-circuited with respect to one another as is the case with strips made from cut out metallic leadframes.

Each conductor has essentially three parts:

An internal end, towards the center of the pattern of the conductors. This end is intended to be connected with a contact pad provided on an integrated circuit chip at the center of the pattern. The internal end extends beyond a central perforation 16 formed in the strip 10 at the center of the pattern. The integrated circuit chip is placed in this central pattern, in principle towards the rear side of the strip (taking the front side of the strip as the side that bears the printed conductors);

An external end that adheres to the dielectrical strip and preferably carries a pad 18, known as a testing pad, through which electrical signals can be applied or collected in order to test the circuit after it is fixed to the strip.

A central part 20 that goes over a peripheral perforation 22 formed in the strip. This central part is the one that will be used as the external connection pin for the integrated circuit when it is encapsulated.

In the example shown in FIG. 1, the central perforation 16 and the peripheral perforations 22 are separated from the dielectrical material of the strip by bridges 24. These bridges 24 increase the mechanical strength of the conductors 14 which adhere to the dielectric both on the outside (towards the testing pads beyond the peripheral perforation 22) and on the inside (on the bridge 24, towards the internal end of the conductors).

In certain cases, for small circuits, the central perforation 16 and the peripheral perforations 22 may be combined into one and same perforation. In this case, the conductors 14 are supported on only one side and jut out all along their length corresponding to the central part and the internal end. It can be seen that this arrangement is possible only if this length is not excessive.

In the prior art, the process for manufacturing the strip of components consisted firstly in electrically connecting the internal ends of the conductors to an integrated circuit chip positioned at the center of the pattern of conductors. This connection is done, for example, by directly welding the ends of the conductors to the various contact pads provided on the chip. In principle, the welding is done by thermocompression. Then a drop of protective polymerizable resin (epoxy resin) is deposited on the upper surface of the chip (the surface containing the contact pads). This drop of resin coats the sides more or less completely and, in general, does not coat the rear side of the chip at all.

After the resin is polymerized, the strip of components is ready. The individual components can then be tested by means of the testing pads 18 corresponding to each of the external connection conductors of the integrated circuit.

The user who receives the strip then only has to perform a cutting out operation in order to:

Separate an integrated circuit from the rest of the strip,

Cut out the dielectrical strip around the encapsulated circuit, and cut out the conductors 14 between their external end and their central part so as to obtain an encapsulated circuit from which there emerge the external connection pins comprising the central part 20 which previously extended over a peripheral perforation 22.

FIGS. 2, 3, 4, 5 and 6 give a schematic cross-section view of various structures obtained in this way. The references are the same as in the FIG. 1. The chip is designated by 26 and the polymerizable resin by 28.

FIG. 2 corresponds to a case where there are bridges 24 of dielectrical strip between the central perforation 16 and the peripheral perforations 22.

FIG. 3 corresponds to a case where there is only one central perforation and no peripheral perforation.

FIG. 4 corresponds to a case where, before depositing the drop of resin, a rear protective sheet 30, made of glass fabric impregnated with epoxy resin, for example, has been placed behind the chip.

FIG. 5 corresponds to an example where the conductors formed on the dielectrical strip are not welded directly to the contact pad of the chip but where straps 32 are welded between the printed conductors 14 and the contact pads of the chip.

FIG. 6 corresponds to an example where wires 34, made of gold or aluminium, are welded between the printed circuits 14 and the contact pads of the chip.

In the example of FIGS. 5 and 6, the central perforation of the dielectrical strip 10 becomes unnecessary and only the peripheral perforations remain. In this case, the bridges 24, shown in FIG. 1, take up all the space of the central perforation and the chip lies on the strip, which may possibly be metallized at the location of the chip.

FIG. 7 shows a cross-section view of a strip of encapsulated components according to the invention.

Each component is coated with a thermosetting resin 38 obtained by transfer molding around the dielectrical strip 10 bearing the chips 26 and the thin-film conductors.

FIG. 8 shows a schematic cross-section of the structure of the mold used in the method according the invention.

This mold has two movable plates which, when applied to each other (with the mold closed), demarcate between them the molding cavities corresponding to the position of each component to be coated.

In FIG. 8, the mold has two cavities 40 and 42 used for the simultaneous molding of the two components shown in FIG. 7.

The movable plates that demarcate these cavities are, respectively, a lower plate 44 and a so-called intermediate plate 46.

In the intermediate plate 46, a hole opens into each cavity. These are the hole 48 for injecting thermosetting resin into the cavity 40 and the hole 50 for injecting thermosetting resin into the cavity 42.

This hole is not placed in the closing plane of the plates 44 and 46, i.e. in the plane containing the strip 10 during the molding operation (the plane perpendicular to the sheet in FIG. 7 and extending along the dots-and-dashes line 52).

By contrast, as can be seen in FIG. 7, the injection hole of each cavity is located at quite a distance from the plane containing the strip 10.

The intermediate plate 46 and the lower plate 44 are formed, in their surfaces that face each other, so that they do not crush the various parts of the dielectrical strip (the strip itself, the bridges 24, the printed conductors, the chip 26, etc.) when the mold is closed.

Finally, the mold has an upper plate 54 provided with holes (56 and 58) that face the respective injection holes (48 and 50) of the intermediate plate and are provided with resin-injecting means, symbolized by pistons, 60 and 62 respectively, capable of pushing back the liquid thermosetting resin from the holes 56 and 58 of the upper plate 54 towards the holes 48 and 50 of the intermediate plate and from there into the cavities 40 and 42.

The holes of the upper plate 54 are preferably cylindrical. The holes of the intermediate plate 46 are preferably conical to facilitate the removal of resin stalks after a molding operation, namely the removal of hardened resin remaining in the holes 48 and 50 after the mold is cooled. The method of the invention gives properly shielded components are obtained encapsulated in a package that is quite reproducible. At the same time, the method enables storage on flexible dielectrical strips so that components on strips can be tested individually.

In another embodiment, the injection hole is not pointed vertically, i.e. perpendicularly to the closing plane of the plates, but horizontally, parallel to the plane of the strip 10.

FIG. 9 shows the configuration of the mold with a hole of this type. The mold essentially has an upper plate 64 and a lower plate 66 which together demarcate a molding cavity 68 when they are closed.

The injection is done by a horizontal piston or pistons 70 which push the thermosetting resin back into a conical hole 72 in a direction which is generally parallel to the closing plane of the plates (the plane shown by the dots and dashes 74). The hole 72, however, is at a distance from this plane and, in this embodiment, it is demarcated on one side by the lower plate 66 and on the other side by an intermediate plate 76 which is in contact with the dielectrical film 10 when it is placed in the mold and which, therefore, separates this film from the injection hole 72.

The method of the invention can be used for various configurations of printed conducters, strip perforations and modes of connection between printed circuits and the chip and especially for configurations corresponding to the components of FIG. 6.

What is claimed is:

1. A method for the encapsulation in a thermosetting resin of integrated circuits fixed to a flexible dielectrical strip bearing printed electrical conductors constituting the external connection pins of the integrated circuits, wherein the dielectric strip is laid flat between a first plate and a second plate of a mold, the two plates demarcating between them, when they are in contact with the strip, a parting plane in which the strip is placed and at least one cavity surrounding an integrated circuit and partially surrounding the printed conductors located around this circuit, the cavity being provided with a resin-injection hole located outside the parting plane, and wherein a thermosetting resin is injected into the cavity through the hole.

2. A method for the encapsulation of integrated circuits according to claim 1 wherein the hole is located in one of the plates.

3. A method for the encapsulation of integrated circuits according to claim 1, further comprising an intermediate plate connected to one of said plates so as to be separated from said dielectrical strip, said hole being formed between said intermediate plate and one of said plates, said intermediate plate separating said hole from said dielectric strip.

* * * * *